United States Patent
Urano et al.

(10) Patent No.: US 6,960,864 B2
(45) Date of Patent: Nov. 1, 2005

(54) ELECTROACTIVE POLYMER ACTUATOR AND DIAPHRAGM PUMP USING THE SAME

(75) Inventors: Youji Urano, Ikeda (JP); Harunori Kitahara, Hirakata (JP)

(73) Assignee: Matsushita Electric Works, Ltd., Kadoma (JP)

( * ) Notice: Subject to any disclaimer, the term of this patent is extended or adjusted under 35 U.S.C. 154(b) by 94 days.

(21) Appl. No.: 10/287,500

(22) Filed: Nov. 5, 2002

(65) Prior Publication Data

US 2003/0117044 A1 Jun. 26, 2003

(30) Foreign Application Priority Data

Dec. 25, 2001 (JP) ........................................ 2001-392700

(51) Int. Cl.[7] ............................................... H02N 2/00
(52) U.S. Cl. ..................................................... 310/307
(58) Field of Search ................................ 310/307, 324, 310/328, 365, 366, 367, 369; 347/68, 70, 71

(56) References Cited

U.S. PATENT DOCUMENTS

| | | | |
|---|---|---|---|
| 3,215,078 A | | 11/1965 | Stec ............................ 310/328 |
| 3,314,103 A | * | 4/1967 | Duff et al. ................... 310/328 |
| 3,598,506 A | | 8/1971 | O'Neill ........................ 417/383 |
| 3,781,955 A | * | 1/1974 | Lavrinenko et al. ....... 29/25.35 |
| 3,805,097 A | * | 4/1974 | Yanchich et al. ............ 310/329 |
| 3,858,065 A | * | 12/1974 | Epstein ........................ 310/329 |
| 4,398,116 A | * | 8/1983 | Lewis .......................... 310/334 |
| 4,435,667 A | * | 3/1984 | Kolm et al. ................. 310/367 |
| 4,912,351 A | * | 3/1990 | Takata et al. ........... 310/323.16 |
| 4,961,176 A | * | 10/1990 | Tanaka et al. ............... 367/155 |
| 5,210,455 A | * | 5/1993 | Takeuchi et al. ............ 310/328 |
| 5,262,696 A | * | 11/1993 | Culp ............................ 310/328 |
| 5,327,041 A | | 7/1994 | Culp ............................ 310/328 |
| 5,553,828 A | | 9/1996 | Jaenker ................... 251/129.01 |
| 5,559,387 A | * | 9/1996 | Beurrier ...................... 310/328 |
| 5,825,386 A | * | 10/1998 | Ohashi ......................... 347/71 |
| 6,198,203 B1 | * | 3/2001 | Hotomi ....................... 310/324 |
| 6,201,341 B1 | * | 3/2001 | Fujimoto .................... 310/367 |
| 6,211,605 B1 | * | 4/2001 | Burov et al. ................ 310/328 |
| 6,362,559 B1 | * | 3/2002 | Boyd ........................... 310/359 |
| 6,411,014 B1 | * | 6/2002 | Toda ........................... 310/334 |
| 6,422,690 B1 | * | 7/2002 | Harvey et al. ................ 347/68 |
| 6,439,556 B1 | * | 8/2002 | Baudendistel et al. . 367/140.15 |
| 2003/0006669 A1 | * | 1/2003 | Pei et al. ..................... 310/309 |
| 2003/0125781 A1 | * | 7/2003 | Dohno et al. ................. 607/75 |

FOREIGN PATENT DOCUMENTS

| | | | | |
|---|---|---|---|---|
| DE | 199 38 239 | | 3/2001 | ........... F04B/43/04 |
| EP | 0 534 082 | | 3/1993 | ........... F04B/43/04 |
| JP | 62-11910 | * | 1/1987 | ................. 310/328 |
| JP | 63-242183 | * | 10/1988 | ................. 310/358 |
| JP | 64-55081 | * | 3/1989 | ................. 310/365 |
| JP | 3-270943 | * | 12/1991 | ................... 347/68 |
| JP | 2001-263486 | | 9/2001 | .............. F16J/3/02 |
| WO | 98/09339 | | 3/1998 | |
| WO | 99/54626 | | 10/1999 | |
| WO | 01/33625 | | 5/2001 | |

* cited by examiner

Primary Examiner—Thomas M. Dougherty
(74) Attorney, Agent, or Firm—Oblon, Spivak, McClelland, Maier & Neustadt, P.C.

(57) ABSTRACT

An electroactive polymer actuator, which has the capability of improving response speed and operation reliability of a device utilizing an electroactive effect, comprises a laminate formed by alternately placing a plurality of ring members of an electroactive polymer material having different diameters and a plurality of ring electrodes having different diameters such that each of the ring members is positioned between inner and outer peripheral surfaces of adjacent ring electrodes, and a voltage applying unit for applying a voltage(s) between odd-numbered ring electrodes and even-numbered ring electrodes in the case of counting the ring electrodes in order from an innermost ring electrode of the laminate, to thereby cause a deformation in the laminate. This actuator is preferably used as a diaphragm drive unit of a diaphragm pump.

20 Claims, 6 Drawing Sheets

ELECTROACTIVE POLYMER ACTUATOR AND DIAPHRAGM PUMP USING THE SAME

BACKGROUND OF THE INVENTION

1. Field of the Invention

The present invention relates to an electroactive polymer actuator, which is preferably used for devices such as small-sized diaphragm pumps, and a diaphragm pump using the actuator.

2. Disclosure of the Prior Art

In the past, for devices such as small-sized diaphragm pumps, it has been proposed to use a laminate composed of a sheet of an electroactive polymer material such as silicon rubber and an acrylic material, and a pair of electrode layers formed on both surfaces of the sheet. When a voltage is applied between the electrode layers, a deformation of the laminate happens such that a dimension in the thickness (vertical) direction of the laminate decreases, and the dimension in the horizontal direction of the laminate increases. This phenomenon is known as electroactive effect.

Figure 12:
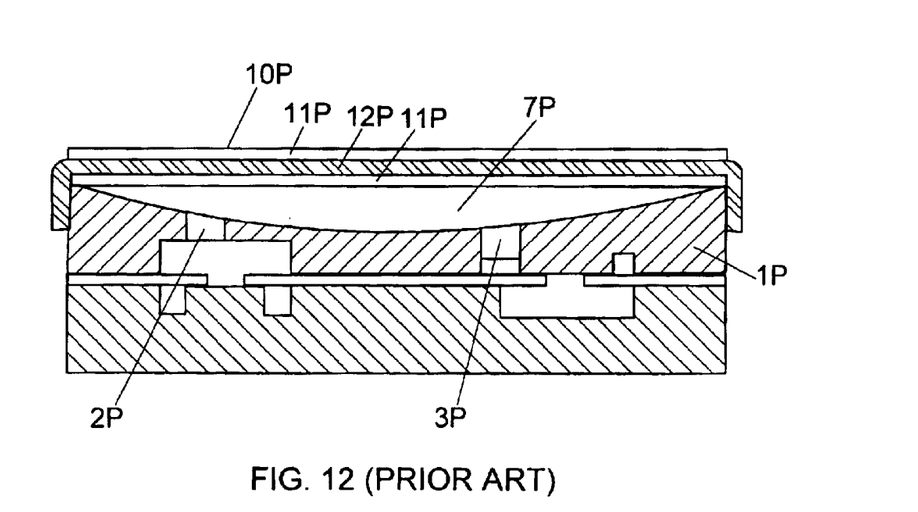
FIG. 12 is a cross-sectional view of a conventional diaphragm pump.

For example, Japanese Patent Early Publication [kokai] No. 2001-263486 discloses a diaphragm pump using the electroactive effect. That is, as shown in FIG. 11, this diaphragm pump comprises a casing 1P having a concave 7P for providing a pump chamber in its top surface and intake and exhaust passages (2P, 3P), and a diaphragm 10P for covering this concave. The diaphragm 10P is of a laminate structure, which is formed with a thin-sheet member 12P of an electroactive polymer material, and a pair of electrode layers 11P formed on both surfaces of the thin-sheet member by a physical vapor deposition such as sputtering.

When a voltage is applied between the electrode layers 11P, a dimension in the thickness direction of the diaphragm 10P decreases and the dimension in the horizontal direction thereof increases. This brings a volume change of the pump chamber that is a space surrounded by the concave 7P and the diaphragm 10P. On the other hand, when the applied voltage is removed, the diaphragm 10P recovers its original shape. Therefore, according to this volume change of the pump chamber, it is possible to suck a fluid such as air into the pump chamber through the intake passage 2P, and then exhaust the air in the pump chamber the exhaust passage 3P. By applying a RF voltage having a required frequency between the electrode layers 11P, this pumping operation can be repeated.

However, in the case of using this laminate 10P as the diaphragm, it is difficult to control the deformation of the diaphragm during the pumping operation. Therefore, it still has plenty of room for improvement from the viewpoint of providing a stable and reliable pumping operation. In addition, since the diaphragm is formed by the laminate 10P including the single thin-sheet member 12P of the electroactive polymer material, there are problems that a deformation force of the diaphragm is relatively small, and a deformation speed thereof is relatively slow. These may lead to reductions in exhaust amount and response speed of the diaphragm pump. Thus, it is said that these problems are causes of preventing the actual use of the devices such as the small-sized diaphragm pump using the electroactive effect.

SUMMARY OF THE INVENTION

In view of the above problems, a concern of the present invention is to provide an electroactive polymer actuator, which includes the capability of improving response speed and operation reliability of a device using electroactive effect.

That is, the electroactive polymer actuator comprises:

a laminate including a tubular member of an electroactive polymer material, a first electrode formed on an inner peripheral surface of the tubular member, and a second electrode formed on an outer peripheral surface of the tubular member; and a voltage applying unit for applying a voltage between the first and second electrodes to cause a deformation in the laminate.

In addition, it is preferred that the laminate of the electroactive polymer actuator further includes:

a second tubular member of an electroactive polymer material, which is placed around the second electrode such that the outer peripheral surface of the tubular member is connected to an inner peripheral surface of the second tubular member through the second electrode; and a third electrode formed on an outer peripheral surface of the second tubular member;

wherein the voltage applying means unit applies the voltage(s) between the first and second electrodes and between the second and third electrodes to cause the deformation in the laminate.

Moreover, to achieve further improved response speed and operation reliability of the device using electroactive effect, another concern of the present invention is to provide an electroactive polymer actuator comprising:

a laminate formed by alternately placing a plurality of ring members of an electroactive polymer material having different diameters and a plurality of ring electrodes having different diameters such that each of the ring members is positioned between inner and outer peripheral surfaces of adjacent ring electrodes; and a voltage applying means for applying a voltage(s) between odd-numbered ring electrodes and even-numbered ring electrodes in the case of counting the ring electrodes in order from an innermost ring electrode of the laminate, to thereby cause a deformation in the laminate.

A further concern of the present invention is to provide an electroactive polymer actuator characterized by a unique arrangement of laminates described below, which includes the capability of improving response speed and operation reliability of a device using electroactive effect. That is, this actuator comprises:

a plurality of laminates each having a triangular prism shape, each of the laminates including a pair of electrodes and an electroactive polymer member, which are alternately placed in a direction of a vertical line extending from a vertex of a triangle that is a general surface of the triangular prism to a base of the triangle, the laminates being arranged as a whole in a regular polygonal pattern such that the vertex of the triangle is positioned in the vicinity of a center of the polygonal pattern, and each of the laminates is spaced from an adjacent laminate by a required distance; and a voltage applying means for applying a voltage between the electrodes spaced from each other by the electroactive polymer material with respect to each of the laminates, to thereby cause a deformation in the laminate.

Another concern of the present invention is to provide an electroactive polymer actuator characterized by a spiral structure formed by winding an elongated laminate described below, which includes the capability of improving response speed and operation reliability of a device using electroactive effect. That is, this actuator comprises:

the spiral structure formed by winding a laminate including an elongated sheet of an electroactive polymer material, a pair of first and second electrode layers formed on opposite surfaces of the elongated sheet, and an insulation layer formed on one of the electrode layers; and a voltage applying means for applying a voltage between the electrode layers to cause a deformation in the spiral structure.

In addition, as a particularly preferred application of the electroactive polymer actuator, the present invention provides a diaphragm pump comprising the electroactive polymer actuator of any one of the above-mentioned electroactive polymer actuators as a diaphragm drive means, and a thin sheet of a flexible material as a diaphragm, on a surface of which the laminate of the electroactive polymer actuator is mounted.

These and still other objects and advantages of the present invention will become apparent from the following detail description of the invention and preferred embodiments of the invention.

DETAIL DESCRIPTION OF THE PREFERRED EMBODIMENT

Preferred embodiments of the present invention are explained in detail referring to the attached drawings. However, these embodiments do not limit the scope of the present invention.

<First Embodiment>

Figures 1A, 1B:
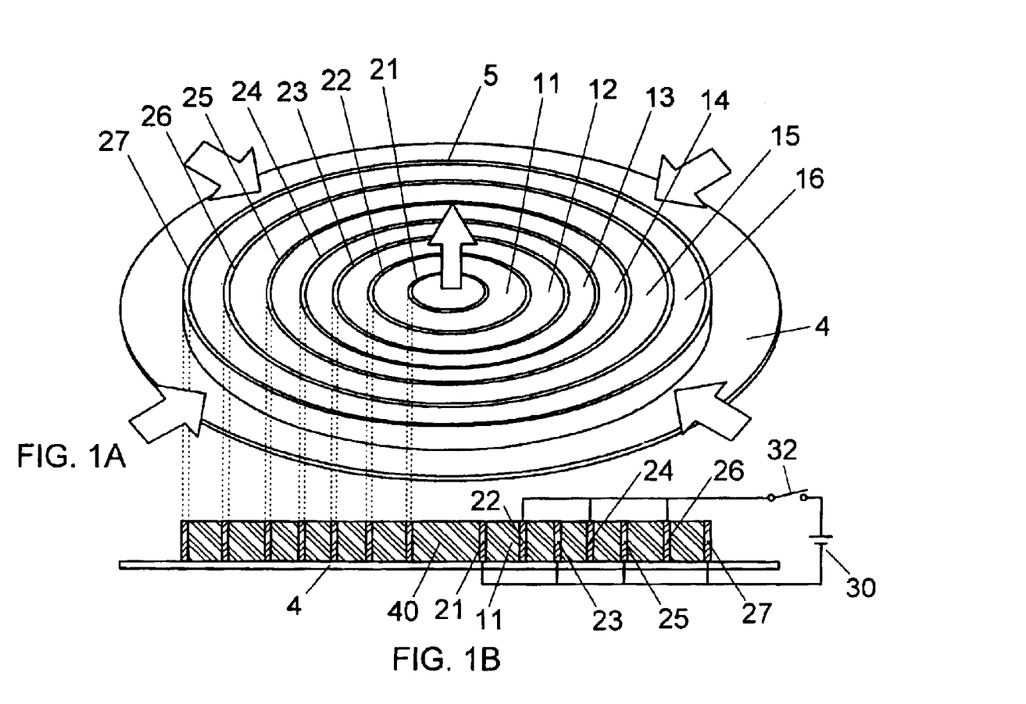
FIGS. 1A and 1B are perspective and cross-sectional views of an electroactive polymer actuator according to a first embodiment of the present invention.

As shown in FIGS. 1A and 1B, an electroactive polymer actuator of the first embodiment has a disk-shaped laminate 5, which is formed by alternately placing first to sixth ring members 11 to 16 having different diameters of an electroactive polymer material such as silicon rubber and an acrylic material, and first to seventh ring electrodes 21 to 27 having different diameters in a concentric pattern such that each of the ring members is positioned between inner and outer peripheral surfaces of adjacent ring electrodes. In FIG. 1A, the numeral 4 designates a flexible thin sheet as a diaphragm, which is attached to a bottom surface of the laminate 5.

For example, the first ring electrode 21 can be obtained by forming a conductive layer on an inner peripheral surface of the first ring member 11, and the second ring electrode 22 can be obtained by forming a conductive layer on an outer peripheral surface of the first ring member 11. To form the conductive layer, for example, it is preferred to use a physical vapor deposition such as sputtering. Then, the second ring member 12 is placed around the second electrode 22 such that the outer peripheral surface of the first ring member 11 is connected to an inner peripheral surface of the second tubular member 12 through the second ring electrode 22. In addition, the third ring electrode 23 can be obtained by forming a conductive layer on an outer peripheral surface of the second ring member 12B. The remaining ring electrodes (24–27) and the remaining ring members (13–16) are placed according to the same manner to obtain the laminate 5. In this embodiment, the first ring electrode 21 is positioned between a center cylinder solid 40 and the first ring member 11.

As shown in FIG. 1B, the electroactive polymer actuator has a voltage applying unit for applying a voltage between odd-numbered ring electrodes and even-numbered ring electrodes in the case of counting the number of the ring electrodes from an innermost ring electrode (i.e., first ring electrode 21) of the laminate 5, to thereby cause a deformation in the laminate 5. In this embodiment, the first, third, fifth and seventh ring electrodes (21, 23, 25, 27) are connected to the negative pole of a DC power supply 30, and the second, fourth and sixth ring electrodes (22, 24, 26) are connected to the positive pole of the DC power supply 30. In FIG. 1B, the numeral 32 designates an on-off switch used to apply the voltage between those electrodes.

Figure 2A:
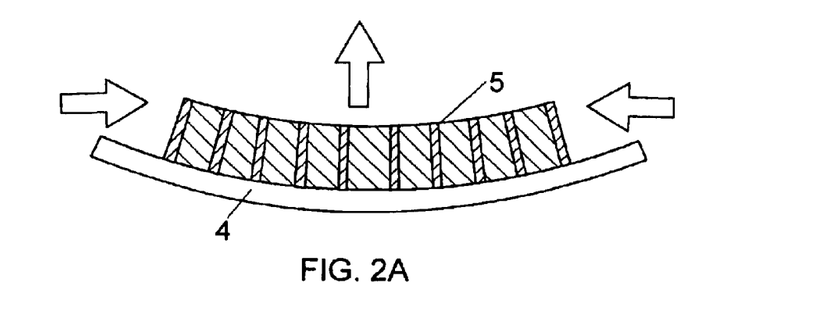
FIGS. 2A and 2B are cross-sectional views illustrating a deformation of the electroactive polymer actuator caused when a voltage is applied.
Figure 2B:
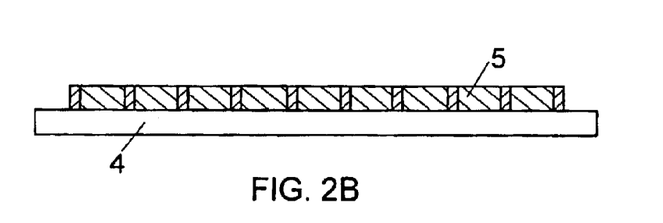

In the electroactive polymer actuator having the above structure, when the switch 32 is turned on, a deformation of the laminate 5 happens such that the dimension in the radial direction of the laminate decreases, and the dimension in the axial direction of the laminate increases, as shown in FIG. 1A. When the laminate 5 is mounted on the flexible thin sheet 4, the flexible thin sheet 4 can be bent by the deformation force of the laminate, as shown in FIG. 2A. Then, when the switch 32 is turned off, the laminate 5 recovers its original shape, as shown in FIG. 2B. Therefore, by repeating this switch operation, the diaphragm of the flexible thin sheet 4 can be periodically deformed.

Figure 3A:
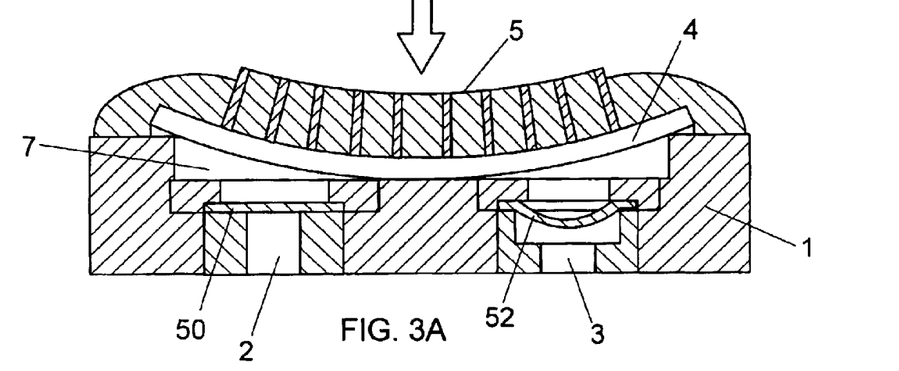
FIGS. 3A and 3B are schematic cross-sectional views of a diaphragm pump using the actuator.
Figure 3B:
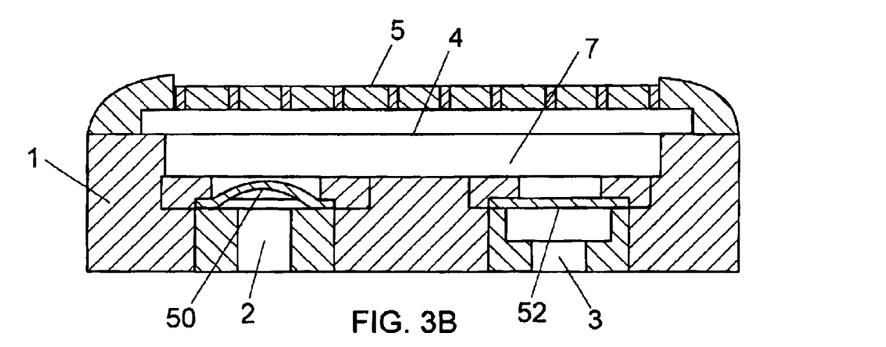

As an example, in FIGS. 3A and 3B, a diaphragm pump using the electroactive polymer actuator of the present invention is explained. This diaphragm pump has a casing 1 having a concave 7 for providing a pump chamber in its top surface and intake and exhaust passages (2, 3) connecting to the concave, and the thin sheet 4 of a flexible material for covering the concave as a diaphragm. The laminate 5 of the electroactive polymer actuator is mounted on a surface of the thin sheet that is opposed to the surface facing the concave 7. When the thin sheet 4 is made of a metal material, the laminate is connected to the thin sheet through a required insulation layer (not shown). The numerals 50 and 52 designate one-way valves built in the intake and exhaust passages (2, 3).

When a voltage is applied to the actuator, the diaphragm 4 is bent by the deformation of the laminate 5 to decrease an internal volume of the pump chamber, as shown in FIG. 3A, so that a fluid such as air is exhausted from the pump chamber through the exhaust passage 3. Then, when the applied voltage is removed, the laminate 5 of the actuator recovers its original shape, as shown in FIG. 3B, so that the fluid comes into the pump chamber through the intake passage 2.

According to the above diaphragm pump of the present invention, it is possible to provide a stable pumping operation at an improved response speed. That is, since the conventional electroactive polymer actuator uses, as a diaphragm, a laminate composed of a single sheet member of the electroactive polymer material and a pair of electrode layers formed on both surfaces of the sheet member, it is difficult to obtain a constant diaphragm motion during the pumping operation, as described above. However, in the present invention, since the laminate 5 having the concentric arrangement of the plurality of ring members of the electroactive polymer material is used as the diaphragm drive means, it is possible to provide a controlled diaphragm motion at a high response speed.

In addition, expansion and contraction forces of the laminate 5 are equal to a sum of the expansion and contraction forces of the respective ring members (11–16). Therefore, the actuator of this embodiment can provide a more powerful pumping action than the conventional actuator using only the single sheet member of the electroactive polymer material as the diaphragm. Moreover, there is another advantage that a deformation amount of the diaphragm can be controlled with accuracy in response to a magnitude of the voltage applied to the actuator.

In the actuator of the present invention, the number of the ring members of the electroactive polymer material is not limited. However, when using the actuator as the diaphragm drive means for the diaphragm pump, it is recommended to select the number of the ring members within a range of 3 to 10 to achieve the high pumping performance with reliability. When the number of the ring members is more than 10, there is a case that the size of the actuator is too big for small-size devices. In addition, the production cost of the actuator may increase.

As an example, the laminate of the electroactive polymer actuator of the present invention can be manufactured by the following method. First, a plurality of tubular members of the electroactive polymer material having different diameters and a plurality of tubular electrodes having different diameters are alternately placed to obtain a solid cylinder body having numerous concentric layers. Each of the tubular electrodes can be obtained by forming a conductive film on the outer and/or inner peripheral surface of the respective ring members with use of a PVD method such as sputtering. Then, the solid cylinder body is cut (or sliced) in a direction perpendicular to its axial direction to obtain a disk-shaped laminate having a desired axial length. According to this method, it is possible to efficiently manufacture the laminate for the electroactive polymer actuator of the present invention.

By the way, as shown in FIG. 1A, the first to sixth ring members (11–16) of the electroactive polymer actuator of this embodiment has a same wall thickness. In this case, it is preferred to apply a plurality of different voltages (V1, V2, V3, V4) between the odd-numbered ring electrodes (21, 23, 25, 27) connected to the positive pole and the even-numbered ring electrodes (22, 24, 26) connected to the negative pole of the DC power supply according to the following manner.

That is, a magnitude of voltage (V1) applied between the first and second ring electrodes (21, 22) spaced by the first ring member 11 is smaller than the magnitude of voltage (V2) applied to the second and third ring electrodes (22, 23) spaced by the second ring member 12. Similarly, the magnitude of voltage (V2) applied between the second and third ring electrodes (22, 23) spaced by the second ring member 12 is smaller than the magnitude of voltage (V3) applied to the third and fourth ring electrodes (23, 24) spaced by the third ring member 13. The magnitudes of the respective voltages applied between the ring electrodes are determined such that an expansion amount in the axial direction of each of the ring members is substantially equal to that of the adjacent ring member. As a result, it is possible to achieve a uniform elongation in the axial direction of the laminate.

Figure 4A:
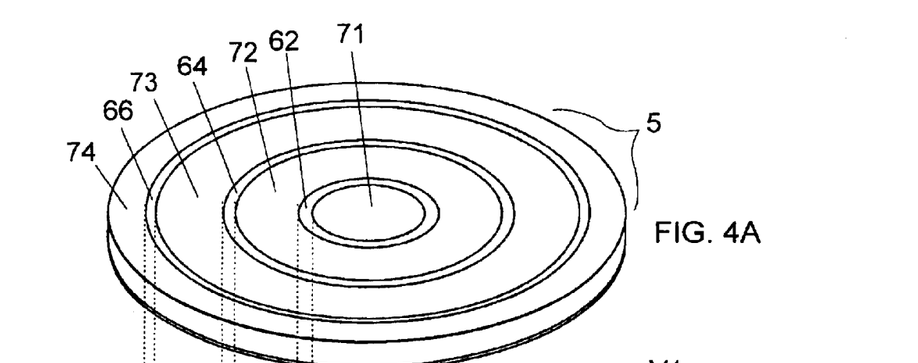
FIGS. 4A and 4B are perspective and cross-sectional views showing an electric circuit of the electroactive polymer actuator.
Figure 4B:
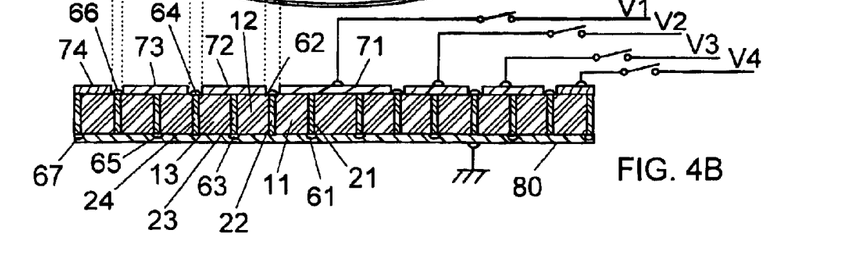

As described above, in the case of applying the different voltages between the odd-numbered ring electrodes and the even-numbered ring electrodes of the laminate, it is preferred to form an electric circuit, as shown in FIGS. 4A and 4B. That is, first insulation layers (62, 64, 66) are formed on exposed ends of the even-numbered ring electrodes (22, 24, 26) on a top surface of the laminate 5, and second insulation layers (61, 63, 65, 67) are formed on exposed ends of the odd-numbered ring electrodes (21, 23, 25, 27) on a bottom surface of the laminate.

Then, a plurality of first conductive layers (71, 72, 73, 74) are formed on the top surface of the laminate 5 such that each of the first conductive layers (e.g., 72) is separated from an adjacent first conductive layer (e.g., 73) by the insulation layer (e.g., 64). As a result, each of the first conductive layers (71–74) is connected to the exposed end of the odd-numbered ring electrodes (21, 23, 25, 27) on the top surface of the laminate 5. On the other hand, a single second conductive layer 80 is formed on the entire bottom surface of the laminate 5 such that the exposed ends of the even-numbered ring electrodes (22, 24, 26) are electrically connected to each other by the second conductive layer. The second conductive layer 80 is used as an earth electrode. To apply the required voltages (V1, V2, V3, V4) between the first conductive layers (71-74) and the earth electrode 80, a plurality of DC power sources (not shown) can be used. Alternatively, a Schenkel circuit may be used. In this case, a plurality of voltages can be obtained by a single power source.

Next, modifications of the electroactive polymer actuator of this embodiment are explained.

Figure 5:
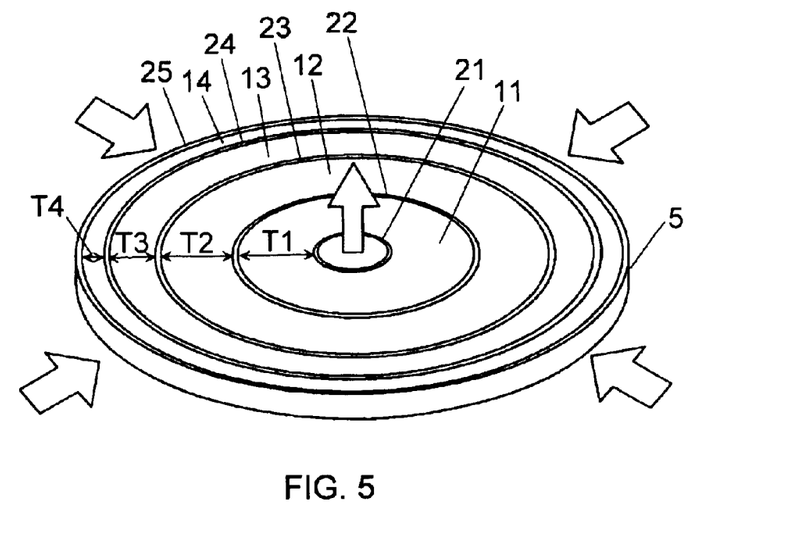
FIG. 5 is a perspective view of a laminate of the electroactive polymer actuator according to a first modification of the first embodiment.

As a first modification, as shown in FIG. 5, it is preferred that a laminate of the electroactive polymer actuator is formed such that wall thicknesses (T1, T2, T3, T4) of first to fourth ring members (11, 12, 13, 14) satisfy the condition of T1>T2>T3>T4. That is, the wall thickness of each of the first to sixth ring members is determined such that when a constant voltage is applied between the odd-numbered ring electrodes connected to the positive pole and the even-numbered ring electrodes connected to the negative pole of the DC power supply 30, an expansion amount in the axial direction of each of the ring members is substantially equal to that of the adjacent ring member. As a result, it is possible to achieve a uniform elongation in the axial direction of the laminate.

Figure 6A:
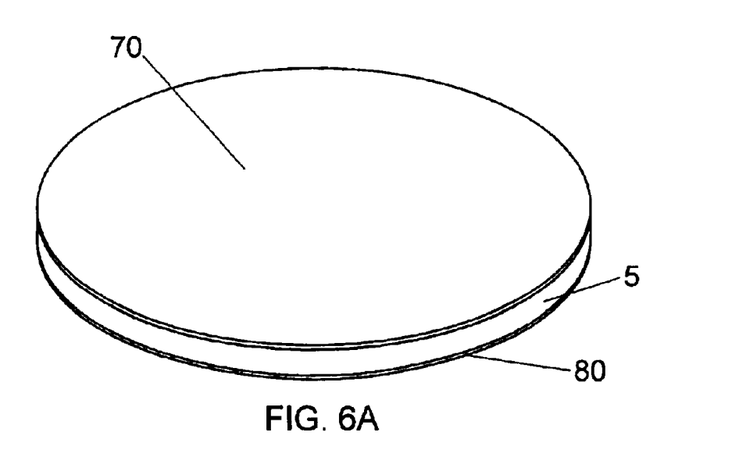
FIGS. 6A and 6B are perspective and cross-sectional views showing an electric circuit of the electroactive polymer actuator of FIG. 5.
Figure 6B:
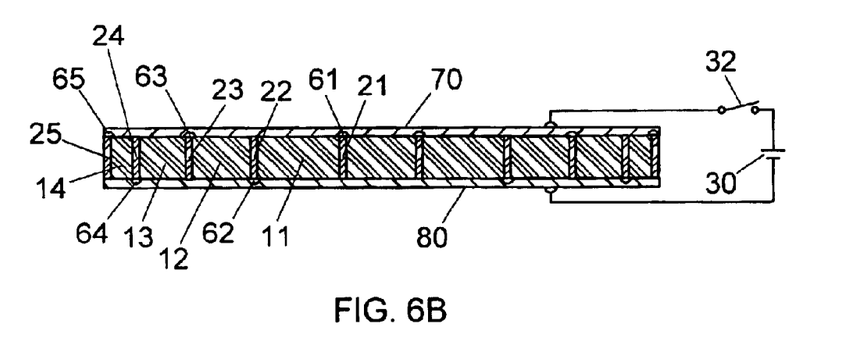

When applying the constant voltage between the odd-numbered ring electrodes (21, 23, 25) and the even-numbered ring electrodes (22, 24) of the laminate 5, it is preferred to form an electric circuit, as shown in FIGS. 6A and 6B. That is, first insulation layers (61, 63, 65) are formed on exposed ends of the odd-numbered ring electrodes (21, 23, 25) on a top surface of the laminate, and second insulation layers (62, 64) are formed on exposed ends of the even-numbered ring electrodes (22, 24) on a bottom surface of the laminate 5.

Then, a first conductive layer 70 is formed on the entire top surface of the laminate 5 such that the exposed ends of the even-numbered ring electrodes (22, 24) on the top surface of the laminate are electrically connected to each other by the first conductive layer. Similarly, a second conductive layer 80 is formed on the entire bottom surface of the laminate 5 such that the exposed ends of the odd-numbered ring electrodes (21, 23, 25) are electrically connected to each other by the second conductive layer. Finally, the DC power supply 30 is connected between the first and second conductive layers (70, 80) through the on-off switch 32.

Figure 7:
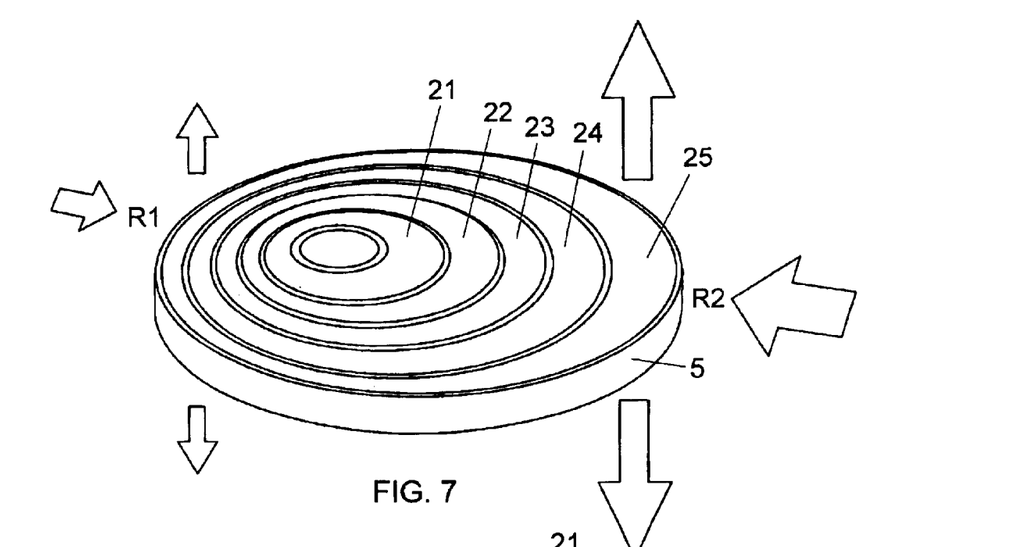
FIG. 7 is a perspective view of a laminate of the electroactive polymer actuator according to a second modification of the first embodiment.
Figure 8:
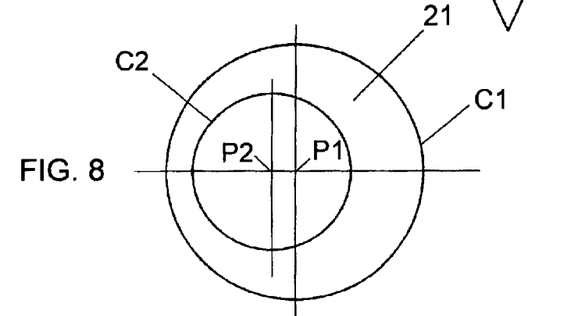
FIG. 8 is a plan view of a ring member of the laminate of FIG. 7

As a second modification, as shown in FIGS. 7 and 8, each of the first to fifth ring members (21–25) may be formed in a cylinder hollow shape such that a center P2 of the inner circle C2 is displaced from the center P1 of the outer circle C1. When a voltage is applied to this laminate 5, a deformation of the laminate happens such that the dimension in the radial direction of the laminate decreases, and the dimension in the axial direction of the laminate increases. In this case, a contraction amount in the radial direction at the side R2 of the laminate is larger than the contraction amount at the side R1 of the laminate. In other words, an elongation in an axial direction at the side R2 of the laminate is greater than the elongation at the side R1 of the laminate, so that the laminate 5 is bent, as shown by the arrows in FIG. 7.

In addition, as a third modification, ring members of the electroactive polymer actuator may be formed in similar elliptic rings, and placed such that center axes of those ring members are consistent with each other and the each of the ring members is positioned between adjacent ring electrodes.

<Second Embodiment>

Figure 9:
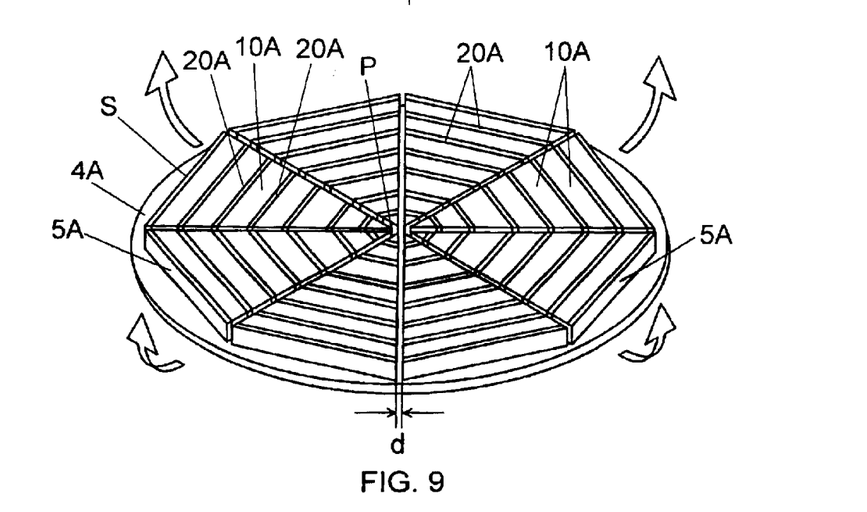
FIG. 9 is a perspective view of a laminate of an electroactive polymer actuator according to a second embodiment of the present invention.

As shown in FIG. 9, an electroactive polymer actuator according to the second embodiment of the present invention has an arrangement of a plurality of laminates 5A each having a triangular prism shape. Each of the laminates 5A includes a plurality electrodes 20A and electroactive polymer materials 10A, which are alternately placed in a direction of a vertical line extending from a vertex P of a triangle that is a general surface of the triangular prism to a base S of the triangle. In this embodiment, the number of the laminates is 8.

Those laminates 5A are arranged as a whole in an octagonal pattern such that the vertex P of the triangle is positioned in the vicinity of a center of the octagonal pattern, and each of the laminates 5A is spaced from an adjacent laminate by a required distance d. This actuator also has a voltage applying unit (not shown) for applying a voltage between the electrodes 20A of each of the laminates to cause a deformation in the laminate. By simultaneously applying the voltages to all of the laminates, a diaphragm 4A attached to the arrangement of the laminates 5A can be bent as in the case of the first embodiment, as shown by the arrows in FIG. 9.

<Third Embodiment>

Figure 10:
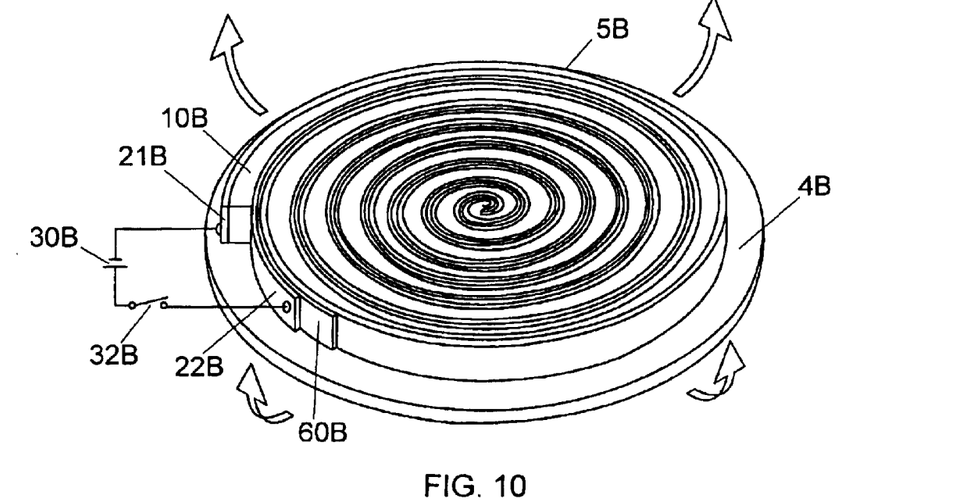
FIG. 10 is a perspective view of a laminate of an electroactive polymer actuator according to a third embodiment of the present invention.

As shown in FIG. 10, an electroactive polymer actuator of the third embodiment has a spiral structure 5B formed by winding a laminate including an elongated sheet 10B of an electroactive polymer material such as silicon rubber and an acrylic material, a pair of electrode layers (21B, 22B) formed on both surfaces of the elongated sheet, and an insulation layer 60B formed on the electrode layer 22B. The insulation layer 60B prevents short circuit between the electrode layers (21B, 22B) in the spiral structure.

This actuator also has a voltage applying unit for applying a voltage between the electrode layers to cause a deformation in the spiral structure 5B. By applying the voltage between the electrode layers (21B, 22B) of the spiral structure 5B, a diaphragm 4B attached to the spiral structure 5B can be bent as in the case of the first embodiment, as shown by the arrows in FIG. 10.

Figure 11A:
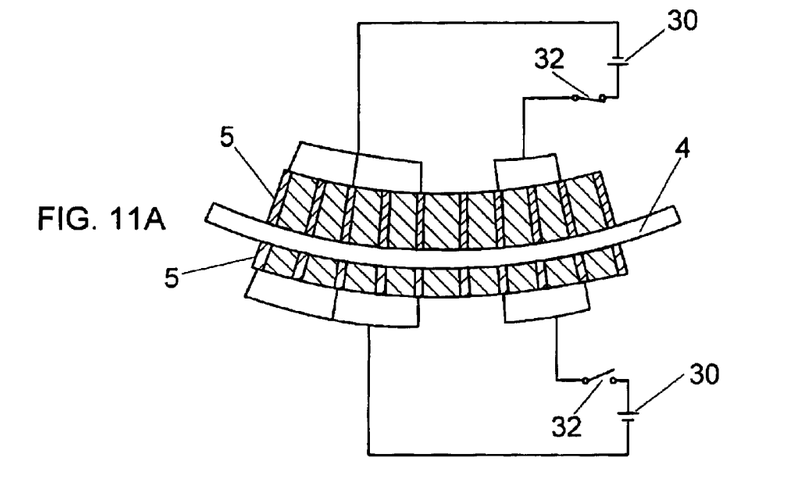
FIGS. 11A to 11C are schematic views showing operations of a bimorph-type diaphragm drive unit using a pair of the electroactive polymer actuators of the present invention.
Figure 11B:
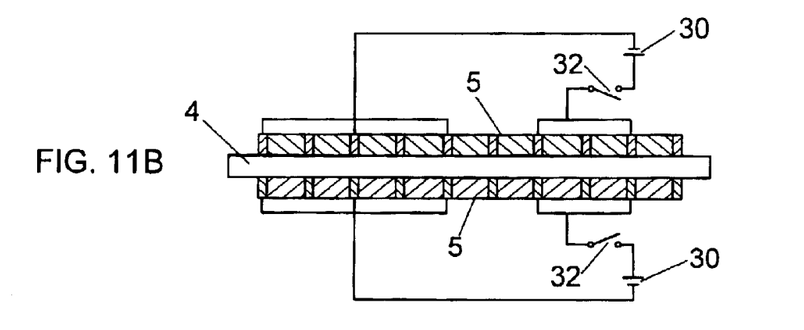
Figure 11C:
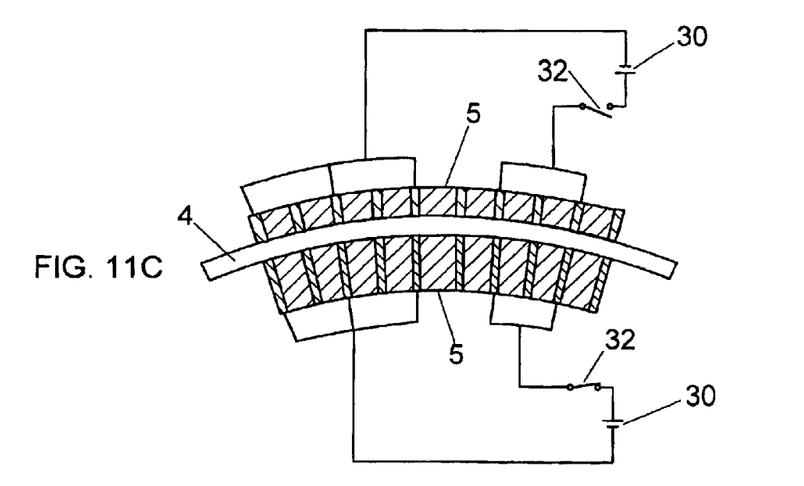

In the above first to third embodiments, a unimorph type diaphragm drive unit, which is characterized in that a single laminate 5 of the electroactive polymer actuator of the present invention is mounted on one surface of the diaphragm 4, was introduced. However, as shown in FIGS. 11A to 11C, a bimorph-type diaphragm drive unit, which is characterized in that a pair of laminates 5 of the electroactive polymer actuators of the present invention are mounted on both surfaces of a diaphragm 4, may be used. In this case, by applying a voltage only to the laminate 5 of the upper actuator, the diaphragm 4 can be bent, as shown in FIG. 11A. In addition, by applying a voltage only to the laminate 5 of the lower actuator, the diaphragm 4 can be bent, as shown in FIG. 1C. Therefore, this bimorph-type diaphragm drive unit can provide an increased range of the diaphragm motion.

What is claimed is:

1. An electroactive polymer actuator comprising:
a laminate including a tubular member of an electroactive polymer material, a first electrode formed on an inner peripheral surface of said tubular member, a second electrode formed on an outer peripheral surface of said tubular member, a second tubular member of an electroactive polymer material, which is placed around said second electrode such that the outer peripheral surface of said tubular member is connected to an inner peripheral surface of said second tubular member through said second electrode, and a third electrode formed on an outer peripheral surface of said second tubular member; and
voltage applying means for applying a voltage between said first and second electrodes to cause a deformation in said laminate,
wherein said voltage applying means applies the voltage(s) between said first and second electrodes and between said second and third electrodes to cause the deformation in said laminate, and each of said tubular member and second tubular member is formed in a hollow cylinder shape having a center of its outer circle displaced from the center of its inner circle.

2. The electroactive polymer actuator as set forth in claim 1, wherein a wall thickness of said tubular member is determined to be greater than the wall thickness of said second tubular member, so that a uniform elongation in the axial direction of said tubular member and said second tubular member is obtained when said voltage applying means applies a same voltage between said first and second electrodes and between said second and third electrodes.

3. The electroactive polymer actuator as set forth in claim 1, wherein said electroactive polymer material is selected from the group consisting of silicone rubber and an acrylic material.

4. An electroactive polymer actuator comprising:
a laminate including a tubular member of an electroactive polymer material, a first electrode formed on an inner peripheral surface of said tubular member, a second electrode formed on an outer peripheral surface of said tubular member, a second tubular member of an electroactive polymer material, which is placed around said second electrode such that the outer peripheral surface of said tubular member is connected to an inner peripheral surface of said second tubular member through said second electrode, and a third electrode formed on an outer peripheral surface of said second tubular member; and voltage applying means for applying a voltage between said first and second electrodes to cause a deformation in said laminate, wherein said voltage applying means applies the voltage(s) between said first and second electrodes and between said second and third electrodes to cause the deformation in said laminate, said tubular member and second tubular member have a same wall thickness, and said voltage applying means applies the voltage between said first and second electrodes, which is smaller than the voltage applied between said second and third electrodes to obtain a uniform elongation in the axial direction of said tubular member and said second tubular member.

5. The electroactive polymer actuator as set forth in claim 4, wherein said tubular member and said second tubular member are of hollow cylinder shapes having different diameters, which are concentrically arranged to obtain said laminate.

6. The electroactive polymer actuator as set forth in claim 4, wherein said electroactive polymer material is selected from the group consisting of silicone rubber and an acrylic material.

7. An electroactive polymer actuator comprising:

a plurality of laminates each having a triangular prism shape, each of said laminates including a pair of electrodes and an electroactive polymer member, which are alternately placed in a direction of a vertical line extending from a vertex of a triangle that is a general surface of said triangular prism to a base of said triangle, said laminates being arranged as a whole in a polygonal pattern such that the vertex of said triangle is positioned in the vicinity of a center of said polygonal pattern, and each of said laminates is spaced from an adjacent laminate by a required distance; and a voltage applying means for applying a voltage between said electrodes spaced from each other by said electroactive polymer material with respect to each of said laminates, to thereby cause a deformation in said laminate.

8. A diaphragm pump comprising the electroactive polymer actuator of claim 7 as a diaphragm drive means, and a thin sheet of a flexible material as a diaphragm, on a surface of which said laminates arranged in said polygonal pattern of the electroactive polymer actuator are mounted.

9. The electroactive polymer actuator as set forth in claim 7, wherein said electroactive polymer material is selected from the group consisting of silicone rubber and an acrylic material.

10. A diaphragm pump comprising:

an electroactive polymer actuator comprising a laminate including a tubular member of an electroactive polymer material, a first electrode formed on an inner peripheral surface of said tubular member, and a second electrode formed on an outer peripheral surface of said tubular member, and voltage applying means for applying a voltage between said first and second electrodes to cause a deformation in said laminate; and a thin sheet of a flexible material as a diaphragm, on a surface of which said laminate of the electroactive polymer actuator is mounted.

11. The diaphragm pump as set forth in claim 10, wherein said electroactive polymer material is selected from the group consisting of silicone rubber and an acrylic material.

12. The diaphragm pump as set forth in claim 10, wherein said laminate further includes:

a second tubular member of an electroactive polymer material, which is placed around said second electrode such that the outer peripheral surface of said tubular member is connected to an inner peripheral surface of said second tubular member through said second electrode; and a third electrode formed on an outer peripheral surface of said second tubular member, wherein said voltage applying means applies the voltage(s) between said first and second electrodes and between said second and third electrodes to cause the deformation in said laminate.

13. The diaphragm pump as set forth in claim 12, wherein said tubular member and second tubular member are of hollow cylinder shapes having different diameters, which are concentrically arranged to obtain said laminate.

14. The diaphragm pump as set forth in claim 12, wherein a wall thickness of said tubular member is determined to be greater than the wall thickness of said second tubular member, so that a uniform elongation in the axial direction of said tubular member and said second tubular member is obtained when said voltage applying means applies a same voltage between said first and second electrodes and between said second and third electrodes.

15. A diaphragm pump comprising;

an electroactive polymer actuator comprising a spiral structure formed by winding a laminate including an elongated sheet of an electroactive polymer material, a pair of first and second electrode layers formed on opposite surfaces of said elongated sheet, and an insulation layer formed on one of said electrode layers, and voltage applying means for applying a voltage between said electrode layers to cause a deformation in said spiral structure; and a thin sheet of a flexible material as a diaphragm, on a surface of which said spiral structure of the electroactive polymer actuator is mounted.

16. The diaphragm pump as set forth in claim 15, wherein said electroactive polymer material is selected from the group consisting of silicone rubber and an acrylic material.

17. A diaphragm pump comprising:

an electroactive polymer actuator comprising a laminate formed by alternately placing a plurality of ring members of an electroactive polymer material having different diameters and a plurality of ring electrodes having different diameters such that each of said ring members is positioned between inner and outer peripheral surfaces of adjacent ring electrodes, and voltage applying means for applying a voltage(s) between odd-numbered ring electrodes and even-numbered ring electrodes in the case of counting said ring electrodes in order from an innermost ring electrode of said laminate, to thereby cause a deformation in said laminate; and a thin sheet of a flexible material as a diaphragm, on a surface of which said laminate of the electroactive polymer actuator is mounted.

18. The diaphragm pump as set forth in claim 17, wherein the number of said ring members is within a range of 3 to 10.

19. A diaphragm pump comprising:

a pair of electroactive polymer actuators, each of the electroactive polymer actuators comprising a laminate formed by alternately placing a plurality of ring members of an electroactive polymer material having different diameters and a plurality of ring electrodes having different diameters such that each of said ring members is positioned between inner and outer peripheral surfaces of adjacent ring electrodes, and voltage applying means for applying a voltage(s) between odd-numbered ring electrodes and even-numbered ring electrodes in the case of counting said ring electrodes in order from an innermost ring electrode of said laminate, to thereby cause a deformation in said laminate; and a thin sheet of a flexible material as a diaphragm, on opposite surfaces of which laminates of the electroactive polymer actuators are mounted.

20. The diaphragm pump as set forth in claim 19, wherein the number of said ring members is within a range of 3 to 10.

* * * * *